United States Patent [19]
Anderson et al.

[11] Patent Number: 5,583,736
[45] Date of Patent: Dec. 10, 1996

[54] MICROMACHINED SILICON ELECTROSTATIC CHUCK

[75] Inventors: Robert A. Anderson; Carleton H. Seager, both of Albuquerque, N.M.

[73] Assignee: The United States of America as represented by the Department of Energy, Washington, D.C.

[21] Appl. No.: 341,089

[22] Filed: Nov. 17, 1994

[51] Int. Cl.$^6$ .................................................. H02N 13/00
[52] U.S. Cl. ............................................. 361/234; 279/128
[58] Field of Search ................................. 361/234; 269/8, 269/903; 279/128

[56] References Cited

U.S. PATENT DOCUMENTS

| | | | |
|---|---|---|---|
| 4,551,192 | 11/1985 | Di Milia et al. | |
| 5,463,526 | 10/1995 | Mundt | 361/234 |

FOREIGN PATENT DOCUMENTS

| | | | |
|---|---|---|---|
| 0452222A1 | 10/1991 | European Pat. Off. | 361/234 |
| 2149697 | 6/1965 | United Kingdom | |

*Primary Examiner*—Jeffrey A. Gaffin
*Attorney, Agent, or Firm*—Luis M. Ortiz; James H. Chafin; William R. Moser

[57] ABSTRACT

An electrostatic chuck is faced with a patterned silicon plate 11, created by micromachining a silicon wafer, which is attached to a metallic base plate 13. Direct electrical contact between the chuck face 15 (patterned silicon plate's surface) and the silicon wafer 17 it is intended to hold is prevented by a pattern of flat-topped silicon dioxide islands 19 that protrude less than 5 micrometers from the otherwise flat surface of the chuck face 15. The islands 19 may be formed in any shape. Islands may be about 10 micrometers in diameter or width and spaced about 100 micrometers apart. One or more concentric rings formed around the periphery of the area between the chuck face 15 and wafer 17 contain a low-pressure helium thermal-contact gas used to assist heat removal during plasma etching of a silicon wafer held by the chuck. The islands 19 are tall enough and close enough together to prevent silicon-to-silicon electrical contact in the space between the islands, and the islands occupy only a small fraction of the total area of the chuck face 15, typically 0.5 to 5 percent. The pattern of the islands 19, together with at least one hole 12 bored through the silicon veneer into the base plate, will provide sufficient gas-flow space to allow the distribution of the helium thermal-contact gas.

21 Claims, 6 Drawing Sheets

MICROMACHINED SILICON ELECTROSTATIC CHUCK

The present invention was conceived and developed in the performance of a U.S. Government Contract. The U.S. Government has rights in this invention pursuant to contract No. DE-ACO4-76DP00789 between the United States Department of Energy and American Telephone and Telegraph Company.

FIELD OF THE INVENTION

The present invention relates generally to chucks used to hold silicon wafers during plasma etching processes and during the fabrication of microelectronics. More specifically, the invention is directed to a micromachined silicon electrostatic chuck which supports silicon wafers undergoing plasma etching with a plurality of densely arranged silicon dioxide islands formed on the chuck's surface in the area between the chuck and the silicon wafer being processed.

BACKGROUND FOR THE INVENTION

In the field of microelectronics, and in particular the fabrication of microelectronics during plasma etching processes, electrostatic chucks have been used to hold silicon wafers during the plasma etching process. Current electrostatic chucks that operate by the "Johnson-Rahbek Effect" consist of a metallic base plate that is typically coated with a thick layer of slightly conductive dielectric material. A silicon wafer of approximately the same size as the chuck is placed on top of the chuck and a potential difference of several hundred volts is applied between the silicon and the base plate of the electrostatic chuck. This causes an electrostatic attraction proportional to the square of the electric field in the gap between the silicon wafer and the chuck face. When the chuck is used in a plasma filled chamber the electric potential of the wafer tends to be fixed by the effective potential of the plasma. The purpose of the dielectric layer on the chuck is to prevent the silicon wafer from coming into direct electrical contact with the metallic part of the chuck and shorting out the potential difference. On the other hand, a small amount of conductivity appears to be desirable in the dielectric coating so that much of its free surface between points of contact with the silicon wafer is maintained near the potential of the metallic base plate; otherwise, a much larger potential difference would be needed to produce a sufficiently large electric field in the vacuum gap between the wafer and chuck. Typically, the face of the chuck has a pattern of grooves in which about 10 torr pressure of helium gas is maintained. This gas provides cooling (thermal contact) between the wafer and the chuck. A pressure of 10 torr is equivalent to about 0.2 psi.

Commercially available electrostatic chucks have many shortcomings. The holding pressure within prior art "Johnson-Rahbek" chucks is quite sensitive to the conductive properties of the dielectric layer—meaning they can be quite temperature sensitive. The dechucking (or release) time is slow in these prior art chuck designs due to the time required to discharge the free surface of the dielectric coating through the high resistance of the coatings, thus extending the processing time for each wafer. The dielectric coatings on these chucks typically are made of a carefully formulated mixture of ingredients and are easily damaged by abrasive forces generated during wafer clamping and by accidental plasma exposure. Furthermore, wear or degradation of the dielectric coating can introduce undesirable foreign material into the plasma chamber. Lastly, these prior art chucks require a large electrical potential, typically several hundred volts, in order to cause the electrostatic attraction necessary to hold the wafer.

The prior art also includes chucks which are made from monolithic slabs of single-crystal silicon. These chucks are custom processed into an array of flat topped protrusions which are elevated 50 micrometers or more above the remainder of the etched silicon surface. The silicon wafer being held is supported by these protrusions. These prior art chucks were not intended to be used in wafer processing steps which require robust wafer cooling; the gap between the wafer and the chuck face in the area surrounding the protrusions is too large for efficient thermal conduction by means of low-pressure helium gas. This large gap was intended, instead, to facilitate the use of vacuum to generate some or all of the holding force.

The most serious shortcomings of these prior art chucks arise from the fact that essentially all of the electrostatic holding force would be generated within the area occupied by the protrusion tops which are in contact (or very nearly so) with the wafer being held. The high fields from which the attractive force arises would be present only in that portion of the chuck face due to a relatively thin, conformal coating of silicon dioxide dielectric which is applied to the entire surface of the chuck face after the array of protrusions has been created. Charge that is unintentionally transferred between the wafer and the chuck face protrusions, either by direct electrical contact or by tunneling and field emission in regions of near contact, would result in locally reduced fields and an associated reduction in the attractive force. De, chucking could also be adversely affected; upon removal of the applied potential difference to allow dechucking some of the transferred charge may remain on the surfaces of the protrusions and cause the wafer not to be released. Lastly, if helium gas cooling were attempted with these prior art chucks, higher electric fields would be required to generate sufficient holding force, compared for example to "Johnson-Rahbek" chucks, because the force arises from a small fraction (typically 25% or less) of the total area of the chuck face—which would greatly increase the likelihood of problems from field emitted charges because field emission current follows a rapidly increasing function of electric field strength.

Thus, there is an existing need for a silicon electrostatic chuck for microelectronic fabrication that will overcome the shortcomings of the prior art by providing an electrostatic chuck wherein a conductive dielectric coating or expensive silicon processing, and high voltage, which give rise to most of the problems of the prior art, is not needed.

SUMMARY OF THE INVENTION

It is therefore an objective of the present invention to fulfill the need for a silicon faced electrostatic chuck that overcomes the shortcomings of prior art electrostatic chucks by providing an electrostatic chuck having a plurality of flat-topped silicon dioxide islands densely patterned over the surface of the silicon face in the area between the chuck and the silicon wafer undergoing processing. In view of the above-described needs, the present invention provides a patterned silicon plate, created by micromachining a silicon wafer, that is bonded or otherwise attached to the metallic base plate. The silicon chuck face is electrically connected to the metallic base plate. Direct electrical contact between the chuck face and the silicon wafer it is intended to hold is prevented by a pattern of flat-topped silicon dioxide islands that protrude a small distance from the otherwise flat surface of the chuck face.

The islands may be formed in any shape (i.e., circles, rings or rails). The islands would be about 10 micrometers in width or diameter and would be spaced about 100 micrometers apart. One or more concentric rings are formed around the periphery of the chuck to contain the low-pressure helium thermal-contact gas mentioned in the previous section. The islands are tall enough, typically less than 5 micrometers, and close enough together to prevent silicon-to-silicon electrical contact between the islands, and the islands occupy only a small fraction, of the order of 1%, of the total area of the chuck face. The island pattern, together with one or more holes bored through the silicon veneer into the base plate, provide sufficient gas-flow space to allow the distribution of helium thermal-contact gas for cooling during the fabrication process.

The patterned silicon plate on the chuck face can be readily and inexpensively fabricated by standard semiconductor processing techniques rather than the elaborate expensive techniques required for the custom processed silicon slabs of the prior art. The chuck face is tough and wear resistant, and particulates less than 2-3 micrometers are unlikely to abrade the chuck or lower the clamping force. Undesirable foreign materials are not exposed to the plasma in the processing chamber during processing. The dechucking time will be short because high resistances do not exist in the charging path, and the problem of sticking due to transferred charge will be minimized. Also, less voltage is required, typically of the order of 100 volts, due to the uniform and small gap between the wafer and the conductive silicon surface in the chuck face.

Additional objects, advantages, and novel features of the invention will become apparent to those skilled in the art upon examination of the following description or may be learned by practicing the invention. The objects and advantages of the invention should be realized and attained by means of the instrumentalities and combinations particularly pointed out in the appended claims.

BRIEF DESCRIPTION OF THE DRAWINGS

The accompanying drawings, which are incorporated in and form part of the specification, illustrate an embodiment of the present invention and, together with the description, serve to explain the operation, features, and advantages of the invention.

DETAILED DESCRIPTION OF THE PREFERRED EMBODIMENTS

Figure 1:
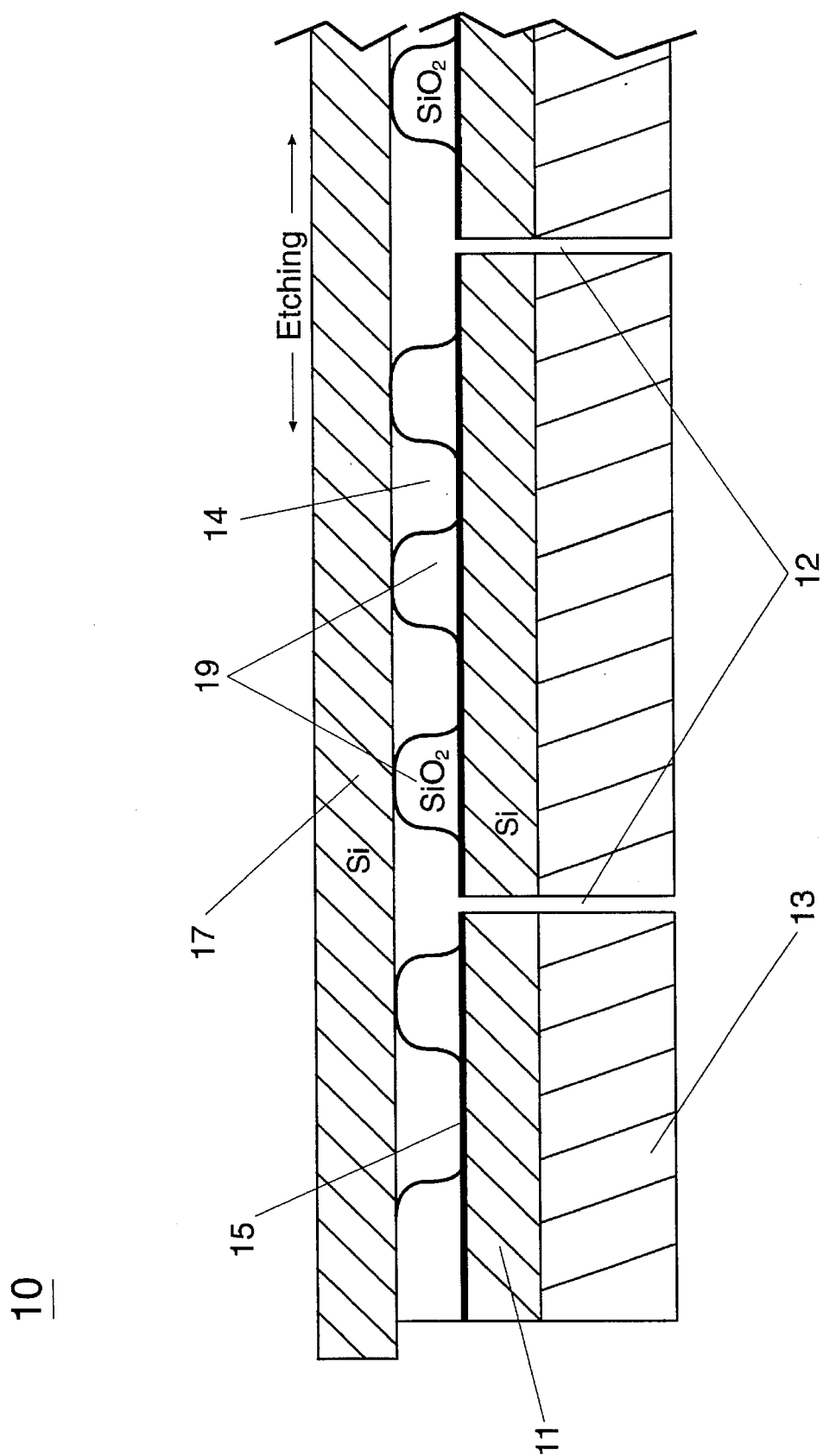
FIG. 1 is an illustration of the preferred embodiment of the micromachined electrostatic chuck of the present invention.
Figure 2:
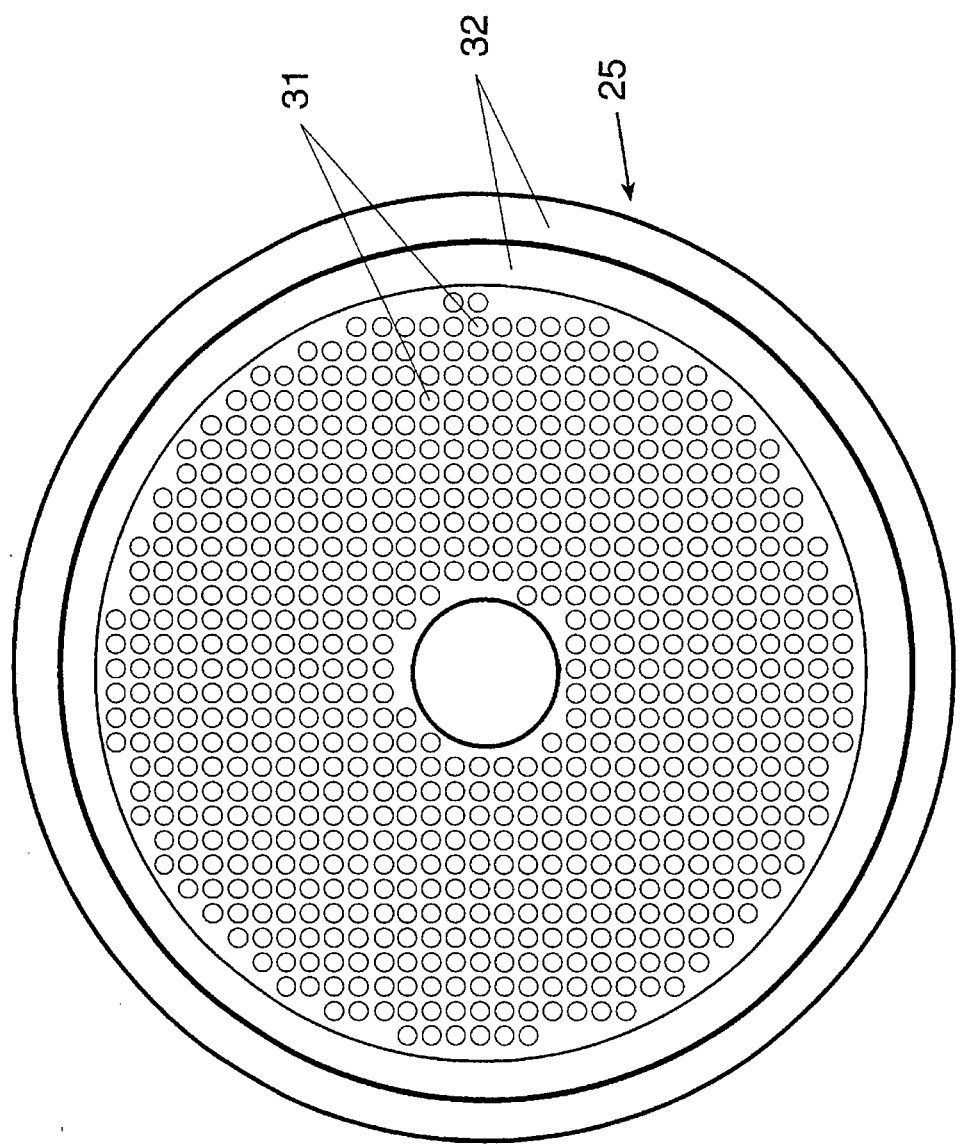
FIG. 2 is a top view of the preferred embodiment.

Referring to FIG. 1, the micromachined silicon electrostatic chuck 10 of the present invention is illustrated. A patterned silicon plate 11, created by micromachining a silicon wafer, is electrically and mechanically attached to a metallic base plate 13. Attachment to the base plate can also be achieved with bonding materials well known in the art. The metallic base plate used for the chuck is aluminum; however, other suitable metallic material may be used as the metallic base plate. Direct electrical contact between the chuck face 15 and the silicon wafer 17 it is intended to support is prevented by a pattern of flat-topped silicon dioxide islands 19 that protrude a small distance, typically less than 5 micrometers, from the otherwise flat surface of the chuck face 15. The islands 19 may be formed in any shape. The islands 19 are close enough together to prevent silicon-to-silicon electrical contact in the space between the islands, and the islands occupy only a small fraction of the total area of the chuck face 15. The pattern of the islands, together with one or more small holes 12 bored through the silicon veneer into the base plate, is intended to provide sufficient gas-flow space 14 to allow the distribution of the helium thermal-contact gas for cooling the supported wafer during the plasma etching process. Referring to FIG. 2, small circular islands 31 would be about 10 micrometers in diameter spaced about 100 micrometers apart with one or more concentric rings 32 around the circular chuck's 25 periphery to contain the low-pressure helium thermal-contact gas used during fabrication and plasma etching. Although the island diameter and spacing stated above may be a good choice, the optimal distances may be chosen given the application anticipated. Practical considerations related to both manufacturability and mechanical stability indicate that the island diameter or width should be greater than the island height. Another constraint is that the island spacing should be small enough to prevent the silicon wafer from being held from contacting the chuck face between the islands—such as contact resulting from the roughness of the silicon wafer and/or the deformation of the silicon wafer due to the attractive force exerted by the chuck. Finally, the electrostatic chuck described is intended to minimize the problems of force reduction during the period the wafer is being held and sticking when dechucking is attempted, due to charge transferred between the wafer and the chuck face in the neighborhood of points of mechanical contact. To accomplish this improvement, the islands would occupy only a small fraction of the chuck-face area. From all of these considerations, a reasonable range of island diameters or widths would be 5 to 200 micrometers, with island spacings in the range 30 to 1000 micrometers. Corresponding pairs of distance would be chosen so that the fraction of the chuck-face area occupied by the islands would fall in the range 0.5% to 5%.

The silicon dioxide islands may be fabricated by any of several standard photolithographic techniques that are used in the microelectric industry. The first step would be to create a continuous layer of silicon dioxide of the desired thickness on the top surface of the silicon plate. This could be accomplished, for example, by the low-pressure chemical vapor deposition (CVD) of tetraethylorthosilicate (TEOS), or by an alternative procedure such as oxidation of the surface of the silicon plate. Next, a photo-resist layer would be applied on top of the silicon dioxide and patterned by a mask beating an image of the islands and sealing rings. The silicon dioxide layer would then be etched down to the silicon surface, except where protected by the resist. This etching could be accomplished either by wet chemistry or by exposure to plasma (dry etch). Finally, the remaining resist would be removed, leaving the silicon dioxide islands and sealing rings protruding from the bare silicon surface.

Figure 3:
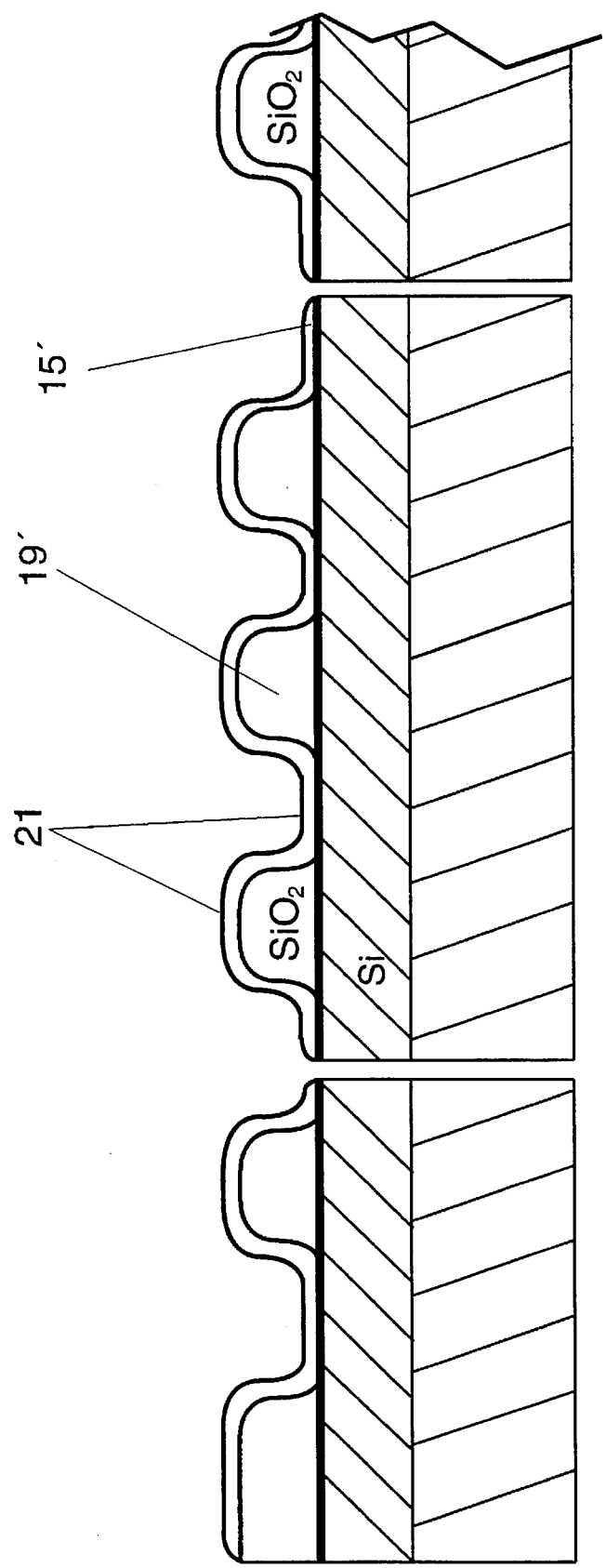
FIG. 3 illustrates another embodiment of the invention wherein a silicon nitride layer is added to the surface of the electrostatic chuck.

Referring to FIG. 3, a thin layer (3000–6000 Angstroms) of silicon nitride 21 can be deposited on both the silicon surface of the chuck face 15' and the silicon dioxide islands 19'. This hard coating will improve wear resistance. Its presence on the bare silicon portions of the chuck face will also help to prevent accidental electrical shorts from particulates on the bottom of the silicon wafer.

Figure 4A:
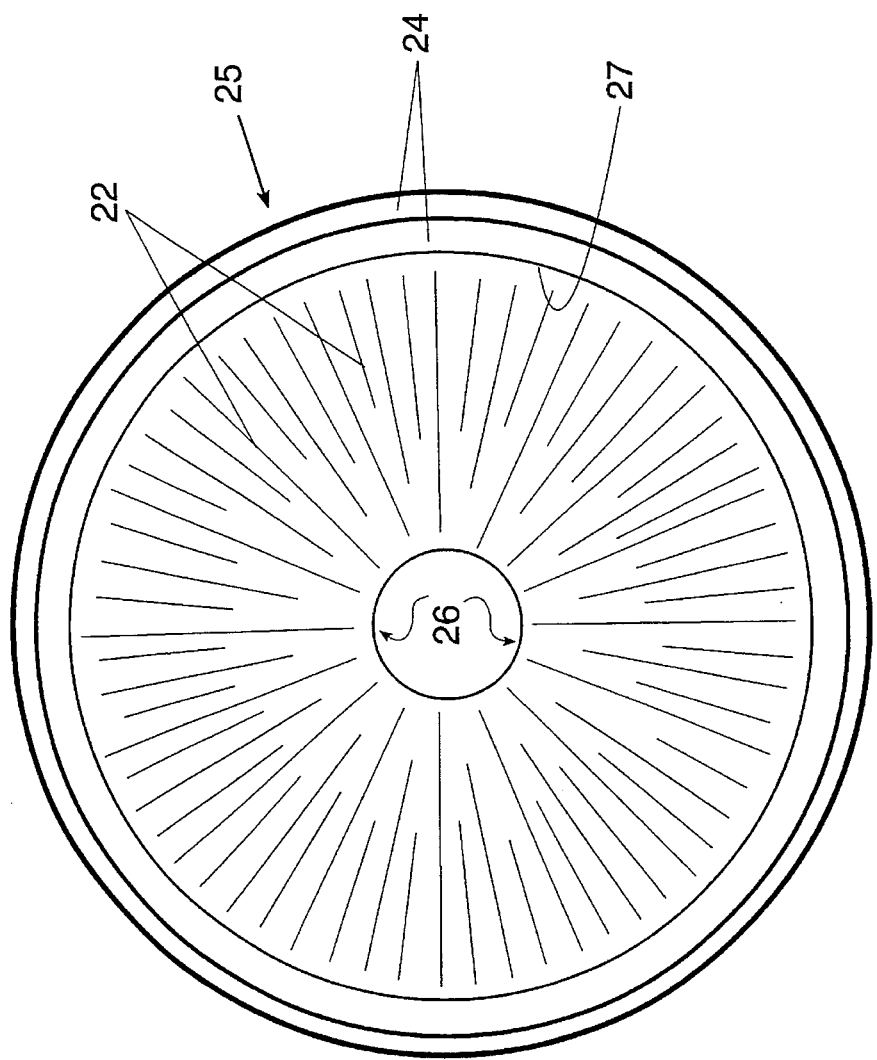
FIG. 4a and 4b illustrate two alternative design configurations of the electrostatic chuck.
Figure 4B:
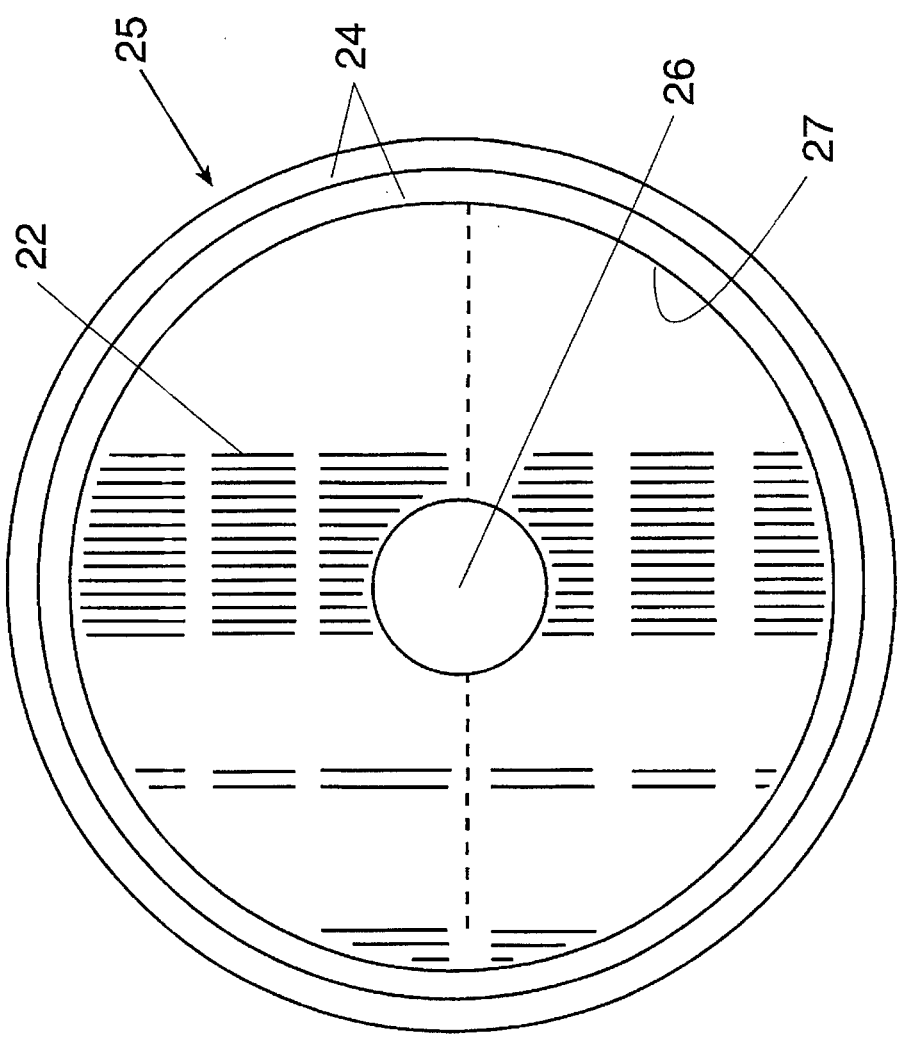

Referring to FIGS. 4a and 4b, the islands can also be designed as rails 22 with a width of about 10 micrometers and designed at any length within the circular chuck 25. One or more concentric rings 24 would also be used with the rail designs. FIG. 4a shows the rails 22 or islands extending outward just after the center hole 26 of the chuck to the outer perimeter 27 just before the seal rings. FIG. 4b shows the rails 22 formed parallel to each other and extending across the chuck within its perimeter 27 and around the center hole 26. Breaks in the rails allow the helium thermal-contact gas to be distributed efficiently. Any configuration or design of the islands would be acceptable so long as the width or diameter, height, spacing between islands, and fraction of chuck-face area occupied is consistent with these teachings. FIG. 4a and 4b represent only two of the many alternative designs that can be used for this invention.

Figure 5:
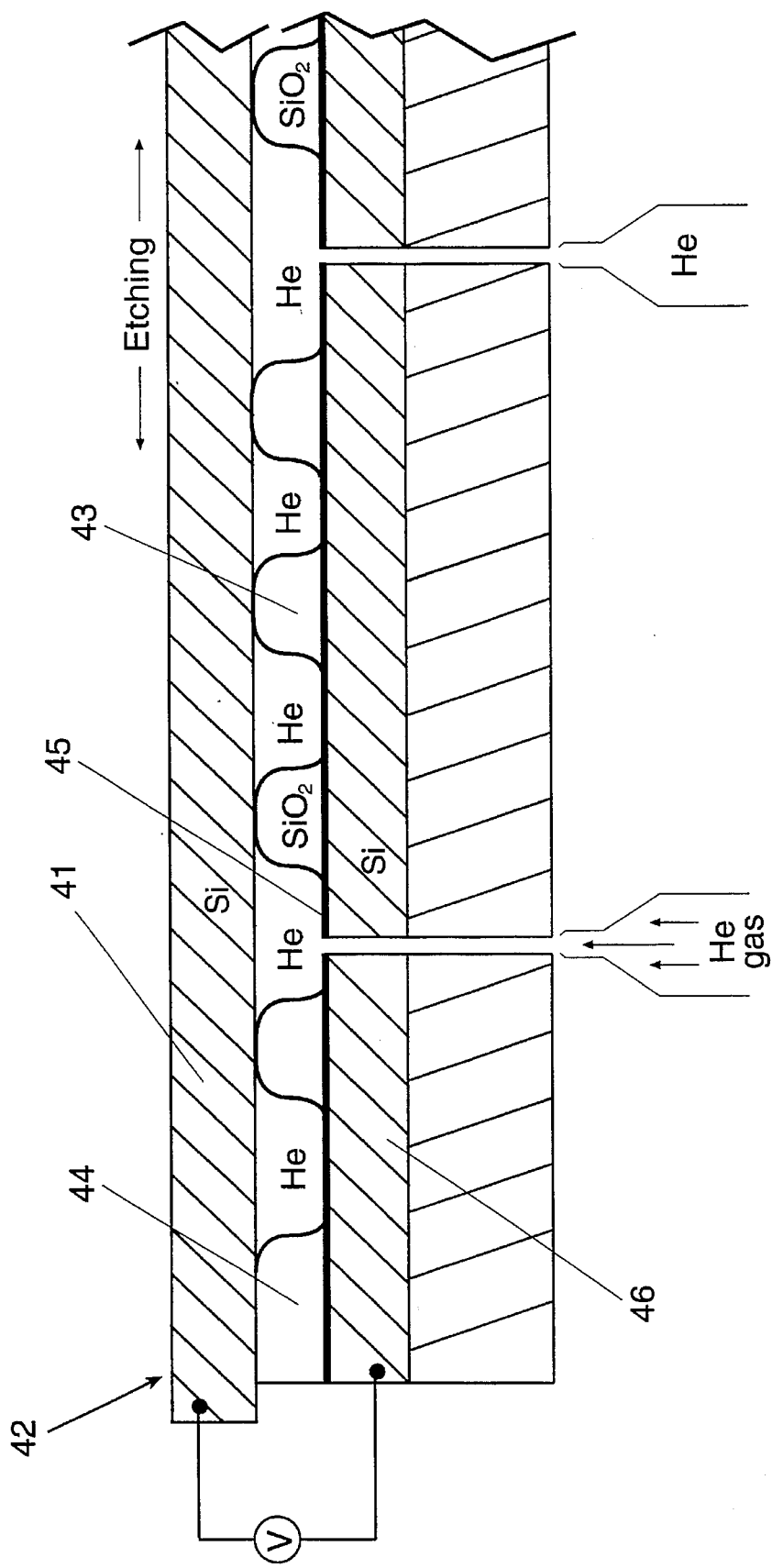
FIG. 5 illustrates the micromachined electrostatic chuck of the present invention in an operational configuration.

Referring to FIG. 5, the electrostatic chuck of the present invention is shown in its operational configuration. A silicon wafer 41 is allowed to rest on the surface of the electrostatic chuck where it may be in contact with the islands 43. The silicon wafer is in contact near its outer perimeter 42 with the seal rings 44 of the electrostatic chuck. The seal created by contact with the silicon wafer 41 and the seal rings 44 allow helium gas to flow in-between the silicon wafer 41, the silicon dioxide islands 43 and the electrostatic chuck's silicon surface 45. An electrical potential of about 100 volts is applied between the silicon wafer 41 and the silicon layer 46 of the electrostatic chuck. During processing, the applied potential difference and helium gas flow within the electrostatic chuck are provided.

The surface profile of a typical silicon wafer has a surface roughness on the order of 0.7 micrometers on a distance scale of the order of a millimeter. If silicon-dioxide islands on the chuck face are about 100 micrometers (0.1 mm) apart, an island height of less than 5 micrometers should be sufficient to prevent extraneous electrical contact between the chuck face and the wafer to be held. With this height and the typical surface roughness of a silicon wafer, the average gap thickness in the area not occupied by the islands would be about 3 micrometers. The open spaces between islands provide a convenient place for particles to reside without shorting out the applied bias or damaging the surface of the chuck during the clamping operation. In that regard, having an island area of the order 1% of the chuck face will insure that the few contamination particles likely to be present rarely rest on a spacer island.

An electrical potential difference is required to hold the silicon wafer being processed to the chuck face. From elementary electrostatic principles, the attractive pressure is equal to $\epsilon_0 E^2/2$, where $\epsilon_0 = 8.854 \times 10^{-12}$ farad/meter and E is the electric field in the gap between the chuck face and the silicon wafer electrostatically held against it. If the potential difference is 100 volts, the field in a 3 micrometer gap is about $3 \times 10^5$ volt/cm, and the electrostatic pressure is ~4000 pascal. This is equivalent to about 0.6 psi, or about 3 times larger than the pressure of the helium thermal-contact gas. This is a typical operating pressure for a commercial electrostatic chuck. Thus, a potential difference of 100 volts should be ample—although higher operating voltages could be used if needed. Electrical breakdown of the silicon dioxide islands is unlikely to be a problem since silicon dioxide can easily withstand electric fields of $5-7 \times 10^6$ V/cm. If breakdown were found to be a problem, however, the silicon dioxide protrusions could be fabricated inside recessed areas in the silicon surface to give them greater dielectric thickness. With an applied potential difference of only 100 volts, it also seems very unlikely that secondary-electron multiplication could lead to the surface-flashover mode of electrical breakdown along the side of an island.

The patterned silicon plate on the chuck face is attached to the metallic base plate of the chuck in a manner that provides electrical contact to the base plate. In the preferred embodiment, the silicon plate is bonded to the metallic body with a thin layer of metal-filled conductive epoxy cement. However, other means of attachment may be preferable if the chuck is intended to be operated well above room temperature. As an example, the silicon plate may be held mechanically by structures on the metallic base plate which entrain beveled edges on the silicon plate. Such a means of attachment may become practical at elevated use temperatures where the enhanced heat radiation may obviate the need for a thermal-contact gas. Alternatively, the silicon plate may be welded to the base plate by means of an intermetallic interfacial layer. In this case, the base plate may bear a pattern of closely-spaced, deeply machined concentric grooves designed to relieve the radial shear stress arising from the differential thermal expansion between the silicon plate and the base material.

As stated hereinbefore, the micromachined silicon electrostatic chuck is patterned and fabricated by standard semiconductor processing techniques which are well known in the art. The chuck face is tough and wear resistant such that particulates less than 2–3 micrometers in diameter will not abrade the chuck or lower necessary clamping forces. The chuck design does not allow undesirable foreign materials or contaminants to be exposed to the plasma within the processing chamber. With the elimination of high resistances in the charging path, the chuck's discharge (or dechucking) time is greatly shortened when compared to the prior art. The small fractional area occupied by the raised islands should also facilitate dechucking by greatly reducing sticking. Finally, the small gap between the wafer and the conductive silicon surface in the chuck face will provide excellent capacitive radio-frequency coupling to the plasma during wafer etching.

The foregoing description of the invention has been presented for purposes of illustration. It is not intended to be exhaustive or to limit the invention to the precise forms disclosed. Obvious modifications or variations are possible in light of the above teachings. The embodiments were chosen and described in order to best illustrate the principles of the invention and its practical application to thereby enable one of ordinary skill in the art to best utilize the invention in various embodiments and with various modifications as are suited to the particular use contemplated, as long as the principles described herein are followed. Thus, changes can be made in the above-described invention without departing from the intent and scope thereof. Therefore, it is intended that the specification and the examples be considered as exemplary only, with the true scope and spirit of the invention being indicated in the following claims.

What is claimed is:

1. An electrostatic chuck, comprising:

a metallic base plate;

a silicon plate attached to said metallic base plate; and a plurality of non-conductive support islands formed on the surface of said silicon plate opposite said metallic base plate for preventing electrical contact between the surface of said patterned silicon plate and a silicon wafer undergoing microelectronic processing.

2. The invention of claim 1 wherein said silicon plate is comprised of a micromachined silicon wafer.

3. The invention of claim 1 wherein said metallic base plate is comprised of aluminum.

4. The invention of claim 1 wherein attachment between of said silicon plate and said metallic base plate provides electrical contact between said silicon plate and said metallic base plate.

5. The invention of claim 4 wherein said attachment of said silicon plate to said metallic base plate is with conductive epoxy therebetween.

6. The invention of claim 4 wherein said attachment of said silicon plate to said metallic base plate is by intermetallic welding of said plates.

7. The invention of claim 4 wherein said attachment of said silicon plate to said metallic base plate is by mechanical entrainment of said silicon plate to said metallic base plate.

8. The invention of claim 1 wherein said plurality of support islands further comprise a pattern of flat-topped silicon dioxide islands that protrude a small distance from the patterned silicon plate surface of said chuck wherein direct electrical contact between said plate surface and said silicon wafer is prevented.

9. The invention of claim 8 wherein said islands may be formed in the shape of small circular islands.

10. The invention of claim 9 wherein said islands would be about 10 micrometers in diameter and spaced about 100 micrometers apart, and one or more concentric rings are formed around the periphery of said chuck to contain a low-pressure helium thermal-contact gas used during fabrication and plasma etching.

11. The invention of claim 10 wherein said islands are about 3 micrometers tall spaced about 100 micrometers apart to prevent silicon-to-silicon electrical contact in the area created between said islands.

12. The invention of claim 8 wherein said islands may be formed in the shape of narrow rails.

13. The invention of claim 12 wherein said rails would be about 10 micrometers wide and spaced about 100 micrometers apart, are about 3 micrometers tall, and one or more concentric rings are formed around the periphery of said chuck to contain a low-pressure helium thermal-contact gas used during fabrication and plasma etching.

14. The invention of claim 13 wherein said rails are arranged in a radial pattern.

15. The invention of claim 1 wherein said chuck has at least one hole bored through said patterned plate and metallic plate to provide sufficient gas-flow space to allow the distribution of a thermal-contact cooling gas.

16. An electrostatic chuck comprising:
a metallic base plate;
a patterned silicon plate attached to said metallic plate, said patterned silicon plate having an exposed surface opposite attachment to said metallic base plate;
a plurality of densely spaced non-conductive contact means formed on said exposed surface of said patterned silicon plate and protruding a small distance from said exposed surface wherein said electrical contact means prevent direct electrical contact between said patterned silicon plate and a silicon wafer;

wherein said chuck has at least one hole bored through said patterned silicon plate and said metallic base plate to provide sufficient gas-flow space to allow the distribution of helium thermal-contact gas, and said plurality of non-conductive contact means comprise a plurality of support island wherein said plurality of support islands are comprised of a pattern of flat-topped silicon dioxide islands that protrude from said patterned silicon plate exposed surface.

17. The invention of claim 16 wherein said metallic base plate is comprised of aluminum.

18. The invention of claim 16 wherein said islands are circular and would be about 10 micrometers in diameter, spaced about 100 micrometers apart, and protrude about 3 micrometers from said patterned silicon plate surface, and one or more concentric rings are formed around the periphery of said chuck to contain a low-pressure helium thermal-contact gas used during fabrication and plasma etching, and wherein said islands are tall enough and close enough together to prevent silicon-to-silicon electrical contact in the space created between said islands.

19. The invention of claim 16 wherein said islands are rails and are about 10 micrometers wide, spaced about 100 micrometers apart, and protrude less than 5 micrometers from said patterned silicon plate surface, and one or more concentric rings are formed around the periphery of said chuck to contain a low-pressure helium thermal-contact gas used during fabrication and plasma etching, and wherein said islands are tall enough and close enough together to prevent silicon-to-silicon electrical contact in the space created between said islands.

20. The invention of claim 16 wherein said islands are rails arranged in a radial pattern and are about 10 micrometers wide, spaced about 100 micrometers apart, and protrude less than 5 micrometers from said patterned silicon plate surface, and one or more concentric rings are formed around the periphery of said chuck to contain a low-pressure helium thermal-contact gas used during fabrication and plasma etching, wherein said islands prevent silicon-to-silicon electrical contact in area created between said islands.

21. An electrostatic chuck comprising:
an aluminum base plate;
a patterned silicon plate having a silicon surface attached in electrical contact to said aluminum base plate; and
a plurality of support island wherein said plurality of support islands are comprised of a pattern of flat-topped silicon dioxide islands that protrude less than 5 micrometers away from said silicon surface of said patterned silicon plate and said islands are about 10 micrometers wide and spaced about 100 micrometers apart;
wherein said chuck has at least one hole bored through said patterned silicon plate and said aluminum base plate to provide sufficient gas-flow space to allow the distribution of the helium thermal-contact gas, and wherein direct electrical contact between said patterned silicon plate surface and a silicon wafer to be supported is prevented.

* * * * *